(12) United States Patent
Ryu et al.

(10) Patent No.: US 9,142,680 B2
(45) Date of Patent: Sep. 22, 2015

(54) THIN FILM TRANSISTOR ARRAY PANEL HAVING IMPROVED APERTURE RATIO AND METHOD OF MANUFACTURING SAME

(71) Applicant: Samsung Display Co., Ltd., Yongin, Gyeonggi-Do (KR)

(72) Inventors: Hye Young Ryu, Seoul (KR); Ki Won Kim, Suwon-si (KR); Jae Woo Park, Seongnam-si (KR); Kap Soo Yoon, Seoul (KR); Young Joo Choi, Anyang-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 13/725,333

(22) Filed: Dec. 21, 2012

(65) Prior Publication Data

US 2013/0306972 A1    Nov. 21, 2013

(30) Foreign Application Priority Data

May 21, 2012 (KR) .................. 10-2012-0053719

(51) Int. Cl.
| H01L 29/04 | (2006.01) |
| H01L 29/10 | (2006.01) |
| H01L 29/786 | (2006.01) |
| H01L 33/08 | (2010.01) |
| H01L 27/12 | (2006.01) |

(52) U.S. Cl.
CPC ............ *H01L 29/786* (2013.01); *H01L 27/124* (2013.01); *H01L 27/1225* (2013.01); *H01L 33/08* (2013.01)

(58) Field of Classification Search
CPC ...................................... H01L 29/03

USPC ......................... 257/43, 59; 438/104
See application file for complete search history.

(56) References Cited

U.S. PATENT DOCUMENTS

| 8,093,585 | B2 | 1/2012 | Nishimura et al. | |
| 2003/0117542 | A1* | 6/2003 | Choo | ............. 349/43 |
| 2006/0125990 | A1 | 6/2006 | Lee et al. | |
| 2006/0145161 | A1* | 7/2006 | Lee et al. | ........ 257/72 |
| 2007/0184586 | A1* | 8/2007 | Kim et al. | ..... 438/149 |
| 2008/0084603 | A1* | 4/2008 | Song et al. | ..... 359/296 |
| 2009/0309822 | A1 | 12/2009 | Jeong et al. | |
| 2010/0066963 | A1 | 3/2010 | Hwang et al. | |

(Continued)

FOREIGN PATENT DOCUMENTS

| KR | 100560974 | 3/2006 |
| KR | 1020090129805 A | 12/2009 |

(Continued)

*Primary Examiner* — Shaun Campbell
*Assistant Examiner* — Ismail Muse
(74) *Attorney, Agent, or Firm* — Innovation Counsel LLP

(57) ABSTRACT

A thin film transistor array panel according to an exemplary embodiment of the present invention includes: a substrate; a gate line positioned on the substrate; a gate insulating layer positioned on the gate line; a semiconductor layer positioned on the gate insulating layer and having a channel portion; a data line including a source electrode and a drain electrode, the source and drain electrodes both positioned on the semiconductor layer; a passivation layer positioned on the data line and the drain electrode and having a contact hole formed therein; and a pixel electrode positioned on the passivation layer, wherein the pixel electrode contacts the drain electrode within the contact hole, and the channel portion of the semiconductor layer and the contact hole both overlap the gate line in a plan view of the substrate.

19 Claims, 8 Drawing Sheets

(56) References Cited

U.S. PATENT DOCUMENTS

| | | | |
|---|---|---|---|
| 2010/0123654 A1* | 5/2010 | Kimura | 345/92 |
| 2011/0085099 A1 | 4/2011 | Kim et al. | |
| 2011/0085102 A1 | 4/2011 | Kim | |
| 2011/0090417 A1 | 4/2011 | Kim et al. | |
| 2011/0141100 A1* | 6/2011 | Park et al. | 345/214 |
| 2011/0304601 A1* | 12/2011 | Niioka et al. | 345/209 |
| 2012/0305925 A1* | 12/2012 | Misaki | 257/59 |

FOREIGN PATENT DOCUMENTS

| | | |
|---|---|---|
| KR | 1020110062300 A | 6/2011 |
| KR | 10-2012-0007764 A | 1/2012 |
| KR | 1020120000254 A | 1/2012 |

* cited by examiner

THIN FILM TRANSISTOR ARRAY PANEL HAVING IMPROVED APERTURE RATIO AND METHOD OF MANUFACTURING SAME

CROSS-REFERENCE TO RELATED APPLICATION

This application claims priority to, and the benefit of, Korean Patent Application No. 10-2012-0053719 filed in the Korean Intellectual Property Office on May 21, 2012, the entire contents of which are incorporated herein by reference.

BACKGROUND OF THE INVENTION (a) Field of the Invention

Embodiments of the present invention relate generally to flat panel displays. More specifically, embodiments of the present invention relate to thin film transistor array panels with improved aperture ratio, and methods of their manufacture.

(b) Description of the Related Art

A flat panel display such as a liquid crystal display (LCD), an organic light emitting diode (OLED) display, an electrophoretic display, and a plasma display typically includes a plurality of pairs of field generating electrodes and an electro-optical active layer interposed therebetween. The liquid crystal display includes a liquid crystal layer as the electro-optical active layer, and the organic light emitting diode display includes an organic emission layer as the electro-optical active layer. One of the field generating electrodes is generally connected to a switching element to receive an electric signal, and the electro-optical active layer converts the electric signal into an optical signal, thereby displaying a portion of an image.

The flat panel display may include a display panel on which a thin film transistor is formed. Multilayered electrodes, a semiconductor, or the like are patterned on a thin film transistor array panel. In general, one or more masks are used in the patterning process.

Meanwhile, to manufacture high resolution flat panel displays, it is desirable to reduce the pixel size. However, reducing pixel size while still maintaining sufficient aperture ratio, or open areas between the constituent elements of the array panel, has proven challenging.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention provides a thin film transistor array panel improving high resolution and an aperture ratio, and a manufacturing method thereof.

A thin film transistor array panel according to an exemplary embodiment of the present invention includes: a substrate; a gate line positioned on the substrate; a gate insulating layer positioned on the gate line; a semiconductor layer positioned on the gate insulating layer and having a channel portion; a data line including a source electrode and a drain electrode, the source and drain electrodes both positioned on the semiconductor layer; a passivation layer positioned on the data line and the drain electrode and having a contact hole formed therein; and a pixel electrode positioned on the passivation layer, wherein the pixel electrode is connected to the drain electrode through the contact hole, and the channel portion of the semiconductor layer and the contact hole both overlap the gate line in a plan view of the substrate.

The gate line may include a gate electrode protruding from the gate line.

The source electrode may overlap the gate line in a plan view of the substrate.

The drain electrode may overlap the gate line in a plan view of the substrate, and may be shaped so as to be substantially symmetric with respect to a major axis of the gate line.

The width of the channel portion of the semiconductor layer may be substantially the same as the width of the gate line.

The source electrode may overlap the gate line in a plan view of the substrate.

The drain electrode may overlap the gate line in a plan view of the substrate, and may be shaped so as to be substantially symmetric with respect to a major axis of the gate line.

The drain electrode may include an opening exposing a portion of the semiconductor layer.

An exposed portion of the semiconductor layer may be an electrical insulator.

An area of the opening may be smaller than an area of the contact hole.

The gate line may include a curved portion.

The thin film transistor array panel may further include a light blocking member positioned on the substrate, and the light blocking member may substantially completely cover the drain electrode in a plan view of the substrate, and may be shaped so as to be substantially symmetric with respect to a major axis of the gate line.

In a plan view of the substrate, a shape of the semiconductor layer excepting the channel portion may be substantially the same as that of the data line including the source electrode and the drain electrode.

The semiconductor layer may comprise an oxide semiconductor.

A method of manufacturing a thin film transistor array panel according to another exemplary embodiment of the present invention includes: forming a gate line on a substrate; forming a gate insulating layer on the gate line; forming a semiconductor layer on the gate insulating layer; forming a data line including a source electrode and a drain electrode both positioned on the semiconductor layer, a portion of the semiconductor layer lying between the source electrode and drain electrode being a channel portion; depositing an insulating material on the data line and the drain electrode; patterning the insulating material to form a passivation layer having a contact hole; and forming a pixel electrode connected to the drain electrode through the contact hole, wherein the channel portion of the semiconductor layer and the contact hole both overlap the gate line in a plan view of the substrate.

The method may further include patterning a portion of the drain electrode exposed by the contact hole so as to form an opening.

The method may further include plasma-processing a portion of the semiconductor layer exposed by the opening.

The plasma-processed portion of the semiconductor layer may be an electrical insulator.

The plasma processing may include oxygen plasma processing.

An area of the opening may be smaller than an area of the contact hole.

According to an exemplary embodiment of the present invention, the channel portion of the thin film transistor and the contact hole are formed on the gate wire such that a gap between the gate and source and the gate and drain is reduced, and a size of the pixel may be reduced.

DETAILED DESCRIPTION OF EMBODIMENTS

Figure 1:
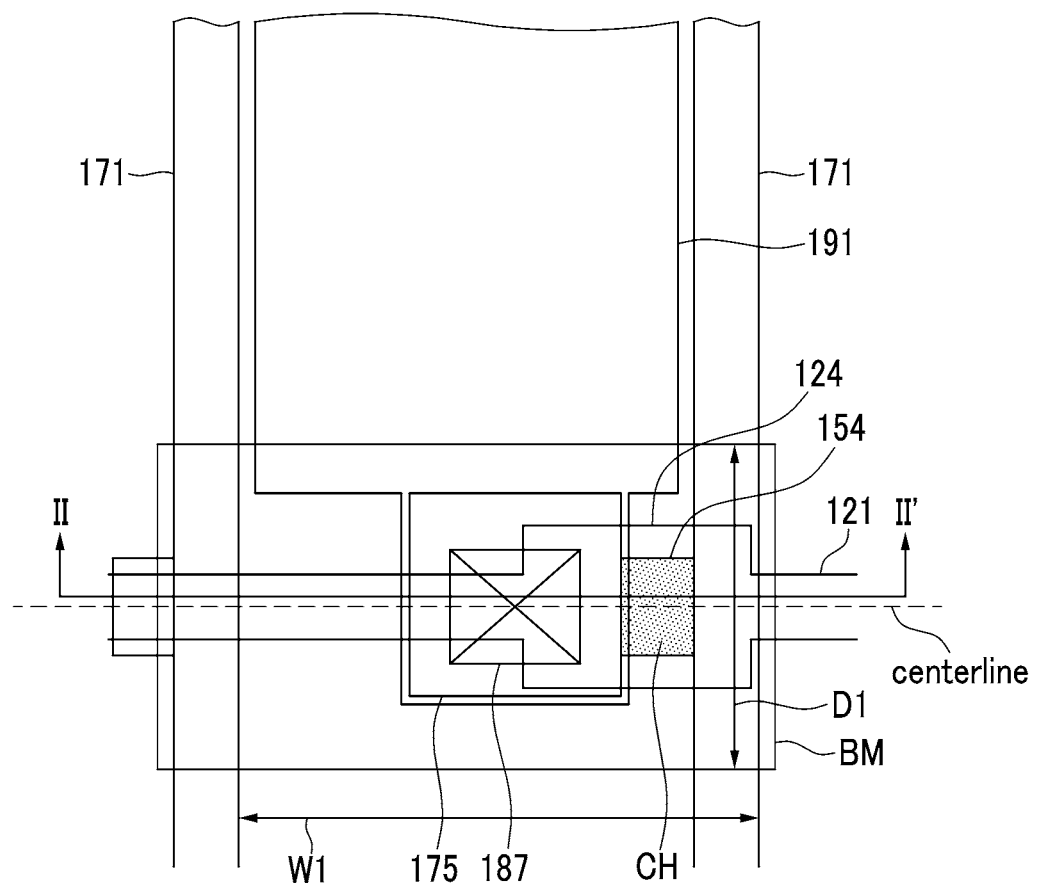
FIG. 1 is a top plan view of a thin film transistor array panel according to an exemplary embodiment of the present invention.

The present invention will be described more fully hereinafter with reference to the accompanying drawings, in which exemplary embodiments of the invention are shown. However, it is to be understood that the invention is not limited to the disclosed embodiments, but, on the contrary, is intended to cover various modifications. As those skilled in the art would realize, the described embodiments may be modified in various different ways, all without departing from the spirit or scope of the present invention.

In the drawings, the thickness of layers, films, panels, regions, etc., are exaggerated for clarity. It will be understood that when an element such as a layer, film, region, or substrate is referred to as being "on" another element, it can be directly on the other element or intervening elements may also be present. Like reference numerals designate like elements throughout the specification.

Figure 2:
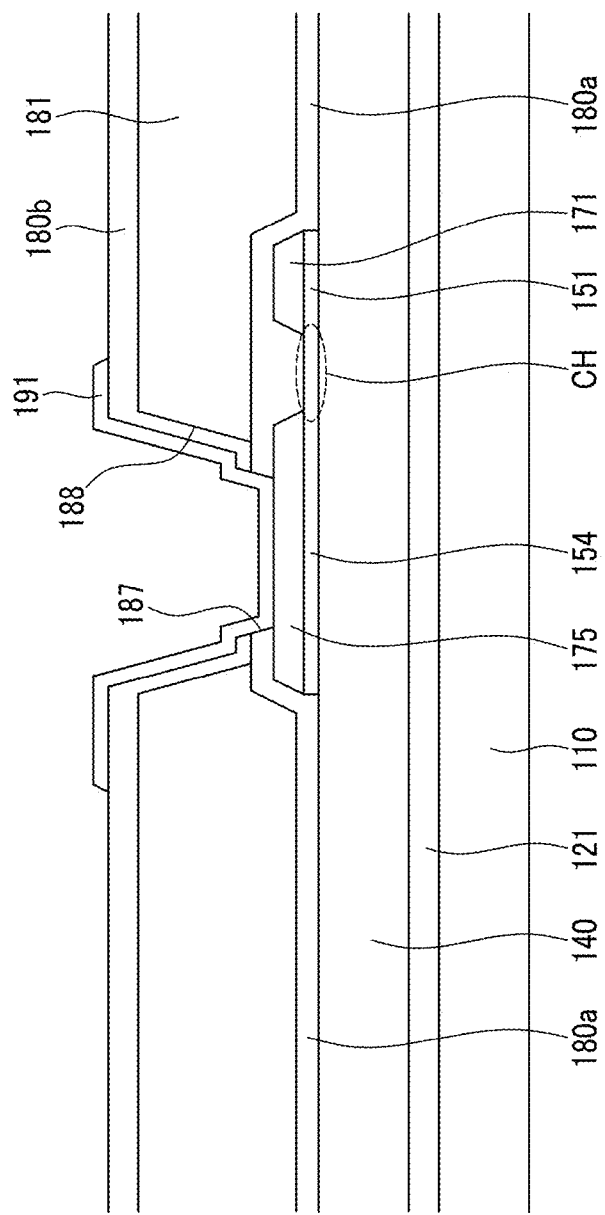
FIG. 2 is a cross-sectional view taken along the line II-II of FIG. 1.

FIG. 1 is a top plan view of a thin film transistor array panel according to an exemplary embodiment of the present invention. FIG. 2 is a cross-sectional view taken along the line II-II of FIG. 1.

Referring to FIG. 1, in a thin film transistor array panel according to the present exemplary embodiment, a gate line 121 is positioned on an insulation substrate 110 made of a transparent material such as a glass or plastic.

The gate line 121 transmits a gate signal and, in the view of FIG. 1, extends in an approximate transverse direction. Each gate line 121 includes gate electrodes 124 protruding from the gate line 121, and an end portion (not shown) having a wide area for connection with another layer or a gate driver (not shown).

The gate line 121 and the gate electrode 124 may be made of an aluminum-based metal of aluminum (Al) or one or more aluminum alloys, a silver-based metal of silver (Ag) or one or more silver alloys, a copper-based metal of copper (Cu) or one or more copper alloys such as CuMn, a molybdenum-based metal of molybdenum (Mo) or one or more molybdenum alloys, chromium (Cr), tantalum (Ta), titanium (Ti), etc.

Also, the gate line 121 and the gate electrode 124 may be made of a transparent conductive material such as ITO (indium tin oxide), IZO (indium zinc oxide), and/or AZO (aluminum doped ZnO).

In the present exemplary embodiment, the gate line 121 and the gate electrode 124 are formed as a single-layered structure; however they may have a dual-layered structure or a triple-layered structure as well.

In the case of a dual-layer structure, the gate line 121 and the gate electrode 124 may include a lower layer and an upper layer, and the lower layer may be made of at least one selected from a group including molybdenum (Mo), one or more molybdenum alloys, chromium (Cr), one or more chromium alloys, titanium (Ti), one or more titanium alloys, tantalum (Ta), one or more tantalum alloys, manganese (Mn), and one or more manganese alloys. The upper layer may be made of at least one selected from a group including an aluminum-containing metal of aluminum (Al) and/or one or more aluminum alloys, a silver-containing metal of silver (Ag) and/or one or more silver alloys, and a copper-containing metal of copper (Cu) and/or one or more copper alloys. In a case of the triple-layer structure, layers having different physical properties may be combined.

A gate insulating layer 140 is formed on the gate line 121 and the gate electrode 124. The gate insulating layer 140 may include silicon nitride (SiNx), silicon oxide (SiOx), silicon oxynitride (SiON), and/or an organic insulating material. The gate insulating layer 140 may have a multilayered structure including at least two insulating layers (not shown). For example, an upper layer of the gate insulating layer 140 may include SiOx and a lower layer may include SiNx, or the upper layer may include SiOx and the lower layer may include SiON. When a semiconductor layer 154 is formed of an oxide semiconductor, and the gate insulating layer 140 contacting the oxide semiconductor 154 includes an oxide, degradation of a channel layer may be prevented.

A semiconductor layer (151 and 154) is formed on the gate insulating layer 140. The semiconductor layer (151 and 154) includes a linear part 151 extending in a longitudinal direction under a data line 171, as well as a protrusion 154 protruding toward the gate electrode 124.

The semiconductor layer (151 and 154) may be made of amorphous silicon, crystallized silicon, or an oxide semiconductor.

The data line 171 includes a source electrode 173 and a drain electrode 175 that are separated from each other on the semiconductor layer (151 and 154). The data line 171 transmits a data signal and extends generally in the longitudinal direction, thereby intersecting the gate line 121.

The data line 171, the source electrode 173, and the drain electrode 175 may be made of a material such as an aluminum-based metal of aluminum (Al) or one or more aluminum alloys, a silver-based metal of silver (Ag) or one or more silver alloys, a copper-based metal of copper (Cu) or one or more copper alloys, a molybdenum-based metal of molybdenum (Mo) or one or more molybdenum alloys, chromium (Cr), tantalum (Ta), and/or titanium (Ti). For example, as the molybdenum alloy, there are Mo—Nb and Mo—Ti. The data line 171, the source electrode 173, and the drain electrode 175 may be made of a transparent conductive material such as ITO, IZO, or AZO. The data line 171, the source electrode 173, and the drain electrode 175 may be made of a multilayered structure including at least two conductive layers (not shown). Exemplary layer compositions may include Mo/Al/Mo, Mo/Al, Mo/Cu, CuMn/Cu, and Ti/Cu.

In the present exemplary embodiment, the source electrode 173 may extend from the data line 171 in the longitudinal direction, and may extend from the data line 171 in a general "U" shape. Any other shapes are contemplated, and the invention is not limited to "U" shapes.

The protrusion 154 of the semiconductor layer has a portion that is not covered by either the source electrode 173 or the drain electrode 175, in particular between the source electrode 173 and the drain electrode 175. This portion may be a channel portion of the thin film transistor. The semiconductor layer (151 and 154) besides the channel portion of the semiconductor layer 154 may have substantially the same plane pattern as the source electrode 173 and the drain electrode 175.

One gate electrode 124, one source electrode 173, and one drain electrode 175 collectively form one thin film transistor (TFT) along with the oxide semiconductor layer 154, and the channel of the thin film transistor is formed between the source electrode 173 and the drain electrode 175.

In the present exemplary embodiment, the channel portion CH is positioned on the extending line of the gate line 121 extending in the horizontal direction of the thin film transistor. The gate line 121 extends in the horizontal direction thereby having a shape that crosses the channel portion CH. Thus, the channel portion CH may overlap a portion of the gate electrode 124 that is protruded from the gate line 121.

Also, in the present exemplary embodiment, the drain electrode 175 is positioned on the extending line of the gate line 121 like the channel portion CH of the thin film transistor. That is, both the drain electrode 175 and channel portion CH overlap the gate line 121 or an extension thereof.

The drain electrode 175 may be formed with up/down symmetry with respect to the gate line 121. That is, the drain electrode 175 may be symmetric with respect to the major axis of the gate line 121.

A lower passivation layer 180a is formed on the data line 171, the source electrode 173, the drain electrode 175, and the exposed protrusion 154 of the semiconductor layer. The lower passivation layer 180a may be made of an inorganic insulator such as silicon nitride or silicon oxide.

The lower passivation layer 180a has a first contact hole 187 exposing a portion of the drain electrode 175. In the present exemplary embodiment, the first contact hole 187 is positioned on the gate line 121, as shown in FIG. 1. In particular, hole 187 is centered over the centerline of the gate line 121.

As described above, in the present exemplary embodiment, the channel portion CH of the semiconductor layer (151 and 154) and the first contact hole 187 are formed on the extending line of the gate line 121 (i.e. each is centered over the centerline of gate line 121) such that a connection connecting a drain region of the thin film transistor and the portion of the drain electrode 175 where the first contact hole 187 is positioned may be omitted. Accordingly, the transverse size of the drain electrode may be reduced, such that a size of the pixel may be reduced.

As described above, in the present exemplary embodiment, the channel portion CH of the semiconductor layer (151 and 154) and the first contact hole 187 are formed on the extending line of the gate line 121 (i.e. each overlaps the gate line 121 when viewed in a plan view of the substrate) such that the width of the transistor, and thus a width D1 of a light blocking member BM, may be reduced, thereby increasing the aperture ratio. The light blocking member BM is present to prevent a light leakage, and is commonly referred to as a black matrix. The light blocking member BM may be formed with up/down symmetry with respect to the gate line 121, i.e. it may be symmetric with respect to the centerline of gate line 121 in plan view.

In the present exemplary embodiment, the drain electrode 175 overlaps the gate line 121 such that a gate-drain parasitic capacitance may be increased. However, if the semiconductor layer (151 and 154) is formed of an oxide semiconductor, the driving voltage may be decreased such that the increase in parasitic capacitance may be minimized. In the present exemplary embodiment, it is preferable that the semiconductor layer (151 and 154) be formed of an oxide semiconductor.

In the present exemplary embodiment, a plane shape of the semiconductor layer (151 and 154) except for the channel portion CH may be the same as the plane shape of the data line 171 including the source electrode 173 and the drain electrode 175. That is, the layers 151, 154 besides portion CH may lie completely under the data line 171, source electrode 173, and drain electrode 175.

An organic insulator 181 having a second contact hole 188 and an upper passivation layer 180b may be positioned on the lower passivation layer 180a. The second contact hole 188 may be wider than the first contact hole 187, and the upper passivation layer 180b may be formed of an inorganic insulator such as silicon nitride or silicon oxide like the lower passivation layer 180a. The organic insulator 181 and the upper passivation layer 180b may be omitted. The contact holes 187 and 188 may be share a common center as shown in FIG. 2, or may be offset from each other.

A pixel electrode 191 is positioned on the upper passivation layer 180b. The pixel electrode 191 is physically and electrically connected to the drain electrode 175 through the contact holes 187 and 188, thereby receiving the data voltage from the drain electrode 175. The pixel electrode 191 may include a transparent conductive oxide such as ITO and IZO.

Figure 3:
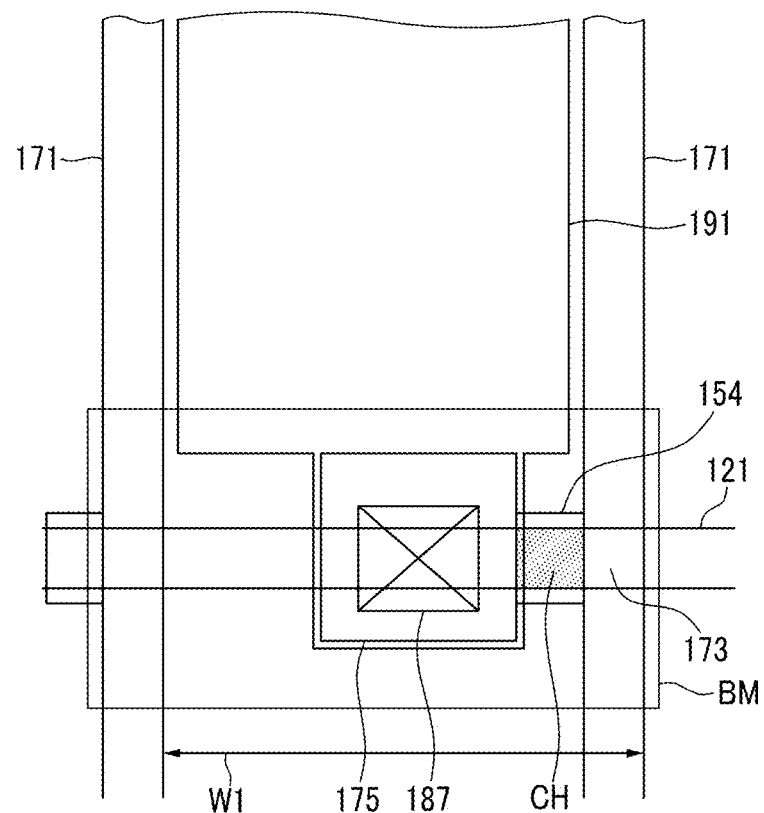
FIG. 3 is a top plan view of a thin film transistor array panel according to another exemplary embodiment of the present invention.

FIG. 3 is a top plan view of a thin film transistor array panel according to another exemplary embodiment of the present invention.

The exemplary embodiment of FIG. 3 is the mainly the same as the exemplary embodiment of FIG. 1 and FIG. 2, and differences will be described.

Referring to FIG. 3, differently from the exemplary embodiment of FIG. 1, the gate electrode 124 is not formed and the gate line 121 extends in the horizontal direction while having substantially uniform width. At this time, although the exposed portions of layers 151, 154 that are not covered by the source electrode 173 and the drain electrode 175 are wider than the gate line 121, the gate electrode 124 is not formed, so that the width in the vertical direction of the protrusion 154 of the semiconductor layer overlapping the gate line 121 is smaller than the width of the protrusion 154 of the semiconductor layer. In other words, the width of the channel portion CH is formed to be substantially the same as the width of the gate line 121.

Also, the protrusion 154 of the semiconductor layer may be formed to completely overlap the gate line 121, and in this case even if a misalignment is generated somehow, the width of the channel portion CH may be uniformly maintained.

According to the present exemplary embodiment, a gate electrode 124 is not formed, so that the area of overlap between the gate line 121 and the source electrode 173 or the drain electrode 175 is reduced, and thereby the parasitic capacitance between the gate and the source or between the gate and the drain may be reduced.

Except for the above described difference from the exemplary embodiment of FIG. 1, the description of the exemplary embodiment of FIG. 1 may be applied to the exemplary embodiment of FIG. 3.

Figure 4:
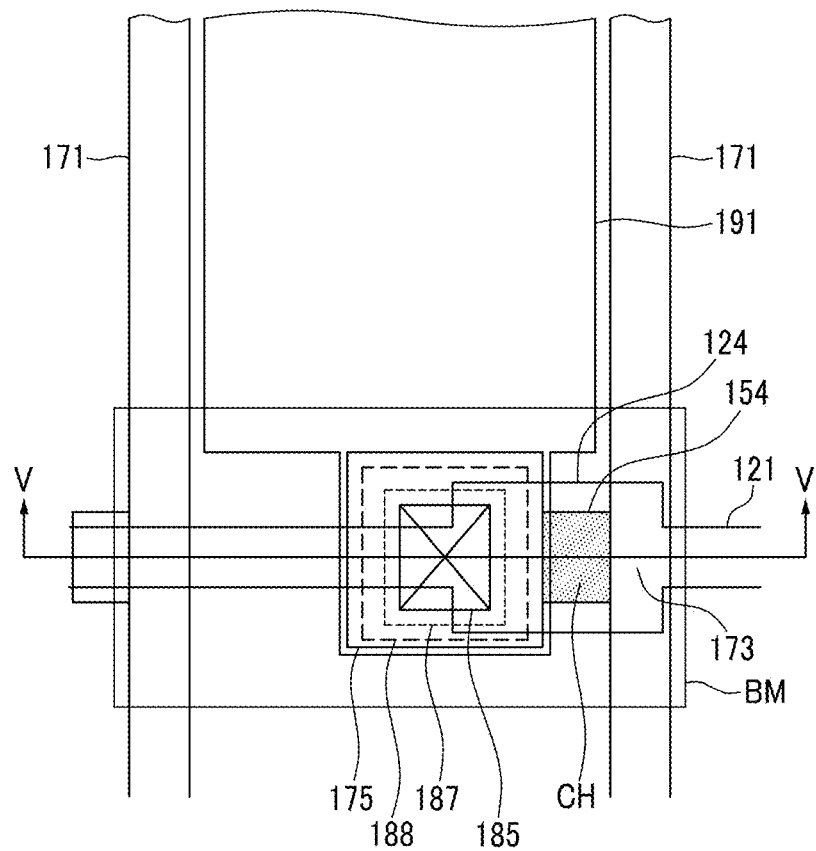
FIG. 4 is a top plan view of a thin film transistor array panel according to another exemplary embodiment of the present invention.
Figure 5:
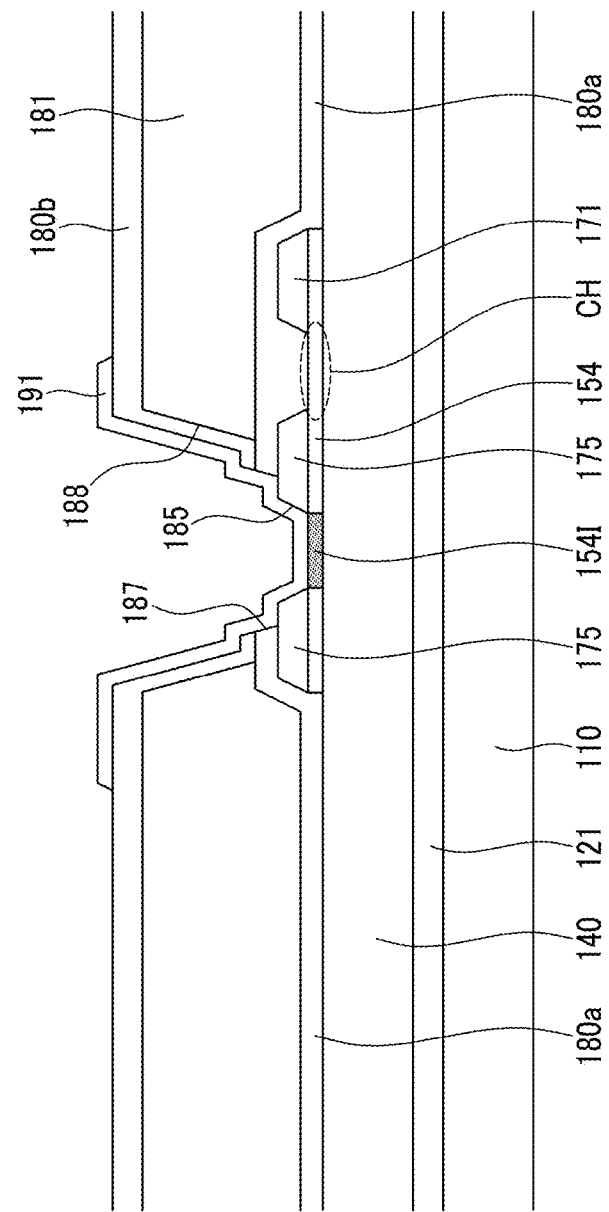
FIG. 5 is a cross-sectional view taken along the line V-V of FIG. 4.

FIG. 4 is a top plan view of a thin film transistor array panel according to another exemplary embodiment of the present invention. FIG. 5 is a cross-sectional view taken along the line V-V of FIG. 4.

The exemplary embodiment of FIG. 4 and FIG. 5 is almost the same as the exemplary embodiment of FIG. 1, and differences will be described.

Referring to FIG. 4 and FIG. 5, the drain electrode 175 has an opening 185 exposing a portion of the protrusion 154 of the semiconductor layer. The opening 185 may be smaller than the first contact hole 187 of the lower passivation layer 180a. The openings 187, 188, and 185 may share a common center, or any of them may be offset from the others by some amount(s). The protrusion 154 of the semiconductor layer exposed through the opening 185 may include an insulating portion 154I having an insulating characteristic. To form the insulating portion 154I, a portion of the drain electrode 175 exposed through the opening 185 may be plasma-processed. The plasma processing may include oxygen plasma processing and may be performed through post-processing after the patterning for the lower passivation layer 180a, the organic insulator 180, and the upper passivation layer 180b. Accordingly, the insulating portion 154I may not have the characteristics of either a semiconductor or a metal.

According to the present exemplary embodiment, the portion of the drain electrode 175 overlapping the gate line 121 is decreased, such that the parasitic capacitance between the gate and the drain may be further reduced. Also, the pixel electrode 191 and the protrusion 154 of the semiconductor layer may directly contact by forming the opening 185, however the insulating portion 154I is formed at the protrusion 154 of the semiconductor layer such that the pixel electrode and the semiconductor layer 154 are not shorted.

In the present exemplary embodiment, the shape of the opening 185 is a quadrangle, similar to the first contact hole 187, whose center is positioned at the center of the first contact hole 187. Accordingly, the pixel electrode 191 contacts the insulating portion 154I of the protrusion 154 of the semiconductor layer, and simultaneously contacts the portion of the drain electrode 175 that is exposed at the edge portion of the first contact hole.

Except for the above described differences from the exemplary embodiment of FIG. 1, the description of the exemplary embodiment of FIG. 1 may be applied to the exemplary embodiment of FIG. 4 and FIG. 5.

Figure 6:
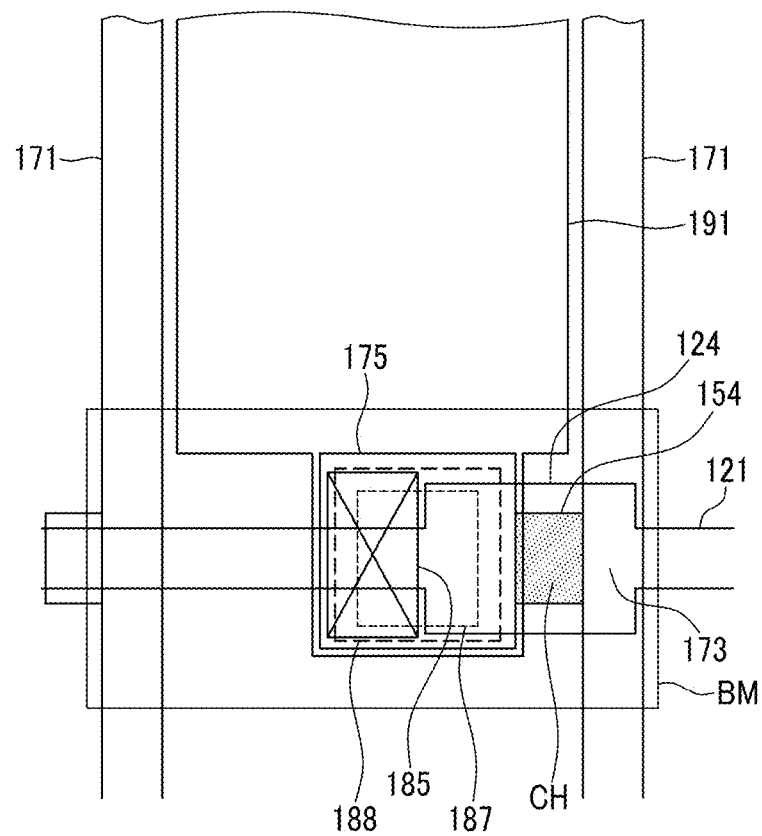
FIG. 6 is a top plan view of a thin film transistor array panel according to another exemplary embodiment of the present invention.
Figure 7:
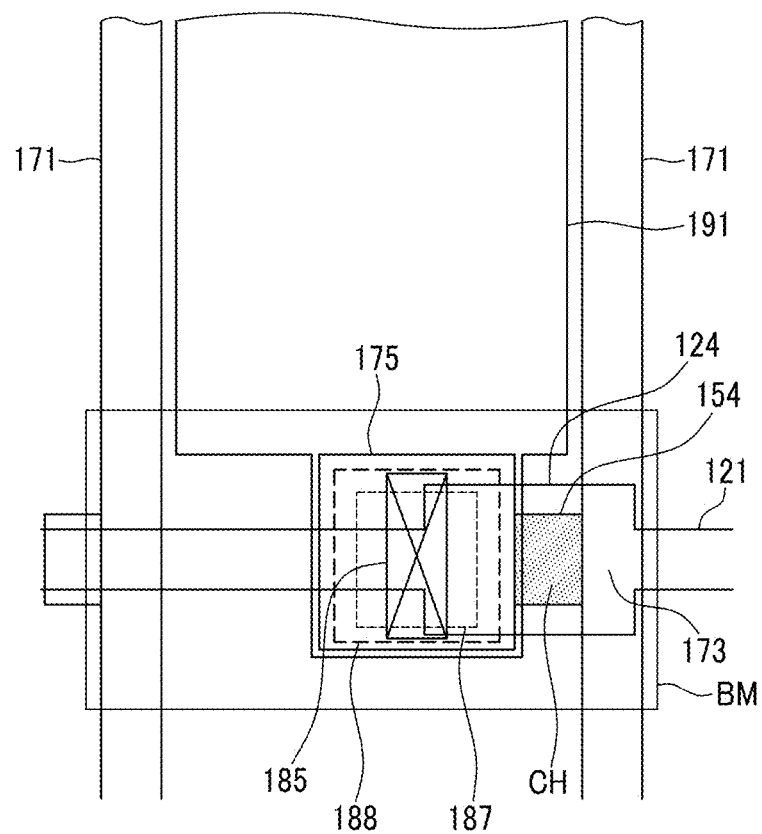
FIG. 7 is a top plan view of a thin film transistor array panel according to another exemplary embodiment of the present invention.

FIG. 6 and FIG. 7 are top plan views of a thin film transistor array panel according to another exemplary embodiment of the present invention.

In the exemplary embodiment of FIG. 6 and FIG. 7, the shape or the position of the opening 185 is changed from the exemplary embodiment of FIG. 4. Accordingly, the differences will be described, and the description of the exemplary embodiment of FIG. 4 and FIG. 5 may be applied to the present exemplary embodiment.

Referring to FIG. 6, the opening 185 is positioned with reference to a left edge of the first contact hole 187. Accordingly, the pixel electrode 191 mostly contacts the drain electrode 175 that is positioned at a right side in the first contact hole 187.

Referring to FIG. 7, the opening 185 is formed with a rectangle shape that is longer in the vertical direction than the first contact hole 187. Accordingly, the pixel electrode 191 may contact the drain electrode 175 that is positioned at the right and left edges of the first contact hole 187.

In the exemplary embodiment of FIG. 6 and FIG. 7, different positions and shapes of the opening 185 are described, however the invention is not limited thereto, and the position and the shape of the opening 185 may be variously changed in any manner that allows the pixel electrode 191 and the drain electrode 175 to be electrically and physically connected.

Figure 8:
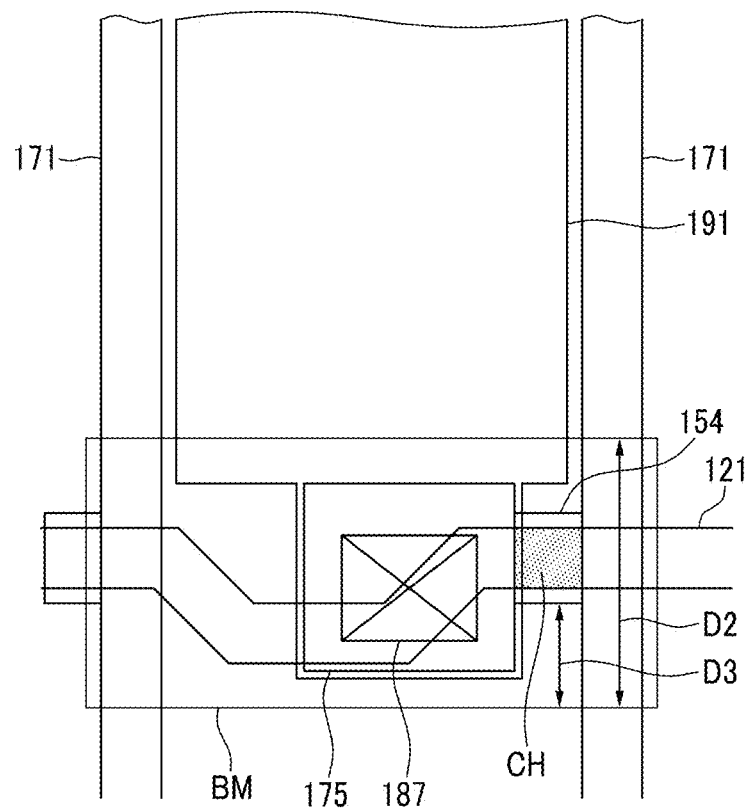
FIG. 8 is a top plan view of a thin film transistor array panel according to another exemplary embodiment of the present invention.

FIG. 8 is a top plan view of a thin film transistor array panel according to another exemplary embodiment of the present invention.

FIG. 8 is a variation of the exemplary embodiment of FIG. 3, which will be further described below.

Referring to FIG. 8, like the exemplary embodiment of FIG. 3, the channel portion CH of the thin film transistor and the first contact hole 187 overlap the gate line 121. Differently from the exemplary embodiment of FIG. 3, the gate line 121 in the present exemplary embodiment includes a curved portion. The curved portion of the gate line 121 is formed between the channel portion CH and the data line 171 disposed far from the channel portion CH. That is, of the two data lines 171 that border a pixel area, the curved or bent portion is located between channel portion CH and the data line 171 located farthest from channel portion CH. As described above, the distance D3 between the edge of the channel portion CH and the corresponding edge of the light blocking member BM is increased such that a possibility that the channel portion CH being exposed outside the light blocking member BM due to misalignment may be reduced.

Next, a method of manufacturing the thin film transistor array panel of the present invention will be described with reference to FIG. 4 and FIG. 5.

The gate line 121 extending in the transverse direction is formed on the substrate 110. According to the exemplary embodiment, the gate electrode 124 extending from the gate line 121 may be formed or may be omitted, depending on the specific embodiment.

The gate insulating layer 140 is formed on the gate line 121, and the semiconductor layer (151 and 154), including the linear portion 151 extending in the longitudinal direction and the protrusion 154 protruding toward the gate electrode 124, is formed on the gate insulating layer 140.

The data line 171, extending in the longitudinal direction and intersecting the gate line 121, is formed on the semiconductor layer (151 and 154). The portion of the data line 171 intersecting the gate line 121 forms the source electrode 173, and the drain electrode 175 is formed at a position separated from the source electrode 173 with respect to the channel portion CH. The drain electrode 175 may be formed to be positioned on the extending line where the gate line 121 extends, i.e. the drain electrode 175 may be formed so as to extend along gate line 121.

In the present exemplary embodiment, the source electrode 173 is formed of a portion of the data line 171, however the source electrode 173 may also be formed to have a "U" shape extending from the data line 171. The "U" shape may be changed into various other shapes.

Inorganic insulating material or organic material is deposited on the data line 171, the source electrode 173, the drain electrode 175, and the exposed protrusion 154 of the semiconductor layer, and is patterned to form both the lower passivation layer 180a having first contact hole 187 and the organic insulator 181 having second contact hole 188. Inorganic insulating material is deposited and patterned on the lower passivation layer 180a and the organic insulator 181 to form the upper passivation layer 180b. The upper passivation layer 180b may include a contact hole (not shown) of a shape overlapping the first contact hole 187.

The deposition sequence and the patterning sequence of the lower passivation layer 180a, the organic insulator 181, and the upper passivation layer 180b may be variously changed. Here, the organic insulator 181 and the upper passivation layer 180b may not be formed if not desired.

In the present exemplary embodiment, a portion of the drain electrode 175 is exposed in the process of forming the lower passivation layer 180a. At this time, the exposed portion of the drain electrode 175 is patterned to form the opening 185 such that the protrusion 154 of the semiconductor layer is exposed by the opening 185. The exposed protrusion 154 of the semiconductor layer is plasma-processed to form the insulating portion 154I. The plasma processing may include oxygen plasma processing. In this way, the semiconductor and metal characteristics are weak in the plasma-processed insulating portion 154I, thereby imparting an insulating characteristic. That is, the plasma-processed portion 154I becomes an electrical insulator.

The area of the opening 185 is smaller than the area of the first contact hole 187 in plan view.

Pixel electrode material is deposited in the opening 185, the first contact hole 187, the second contact hole 188, and the contact hole (not shown) of the upper passivation layer 180b, and this material is then patterned to form the pixel electrode 191.

The manufacturing method for the thin film transistor array panel according to the present exemplary embodiments is described focusing on manufacture of the thin film transistor array panel according to the exemplary embodiment of FIG. 4, however variations to form the thin film transistor array panel according to other exemplary embodiments are known and possible.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

DESCRIPTION OF SYMBOLS

| 110 substrate | 121 gate line |
|---|---|
| 124 gate electrode | 140 gate insulating layer |
| 151, 154 semiconductor layer | 173 source electrode |
| 175 drain electrode | 185 opening |
| 187 first contact hole | 191 pixel electrode |

What is claimed is:

1. A thin film transistor array panel comprising:
a substrate;
a gate line positioned on the substrate;
a gate insulating layer positioned on the gate line;
a semiconductor layer positioned on the gate insulating layer and having a channel portion;
a data line including a source electrode and a drain electrode, the source and drain electrodes both positioned on the semiconductor layer;
a passivation layer positioned on the data line and the drain electrode, and having a contact hole formed therein; and
a pixel electrode positioned on the passivation layer,
wherein the pixel electrode is connected to the drain electrode through the contact hole,
wherein the gate line comprises an electrode portion and a line portion, the electrode portion being the portion of the gate line overlapping with the channel portion and the line portion intersecting the data line,
wherein the gate line extends in a lengthwise direction,
wherein the channel portion of the semiconductor layer and the contact hole both overlap a centerline of the gate line in a plan view of the substrate, the centerline of the gate line extending in a direction the line portion of the gate line extends and crossing the line portion of the gate line, and
wherein the drain electrode includes an opening disposed between two portions of the drain electrode and exposing a portion of the semiconductor layer.

2. The thin film transistor array panel of claim 1, wherein:
the gate line includes a gate electrode protruding from the gate line.

3. The thin film transistor array panel of claim 2, wherein:
the source electrode overlaps the gate line in a plan view of the substrate.

4. The thin film transistor array panel of claim 3, wherein:
the drain electrode overlaps the gate line in the plan view of the substrate, and is substantially symmetric with respect to the centerline of the gate line.

5. The thin film transistor array panel of claim 1, wherein:
a width of the channel portion of the semiconductor layer is substantially the same as a width of the gate line.

6. The thin film transistor array panel of claim 5, wherein:
the source electrode overlaps the gate line in a plan view of the substrate.

7. The thin film transistor array panel of claim 6, wherein:
the drain electrode overlaps the gate line in the plan view of the substrate, and is shaped so as to be substantially symmetric with respect the centerline of the gate line.

8. The thin film transistor array panel of claim 1, wherein:
the exposed portion of the semiconductor layer is an electrical insulator.

9. The thin film transistor array panel of claim 8, wherein:
an area of the opening is smaller than an area of the contact hole.

10. The thin film transistor array panel of claim 1, wherein:
the gate line includes a curved portion.

11. The thin film transistor array panel of claim 1, further comprising:
a light blocking member positioned on the substrate, wherein the light blocking member completely covers the drain electrode in the plan view of the substrate, and is shaped so as to be substantially symmetric with respect to the centerline of the gate line.

12. The thin film transistor array panel of claim 1, wherein:
in the plan view of the substrate, a shape of the semiconductor layer excepting the channel portion is substantially the same as that of the data line including the source electrode and the drain electrode.

13. The thin film transistor array panel of claim 1, wherein:
the semiconductor layer comprises an oxide semiconductor.

14. A method of manufacturing a thin film transistor array panel, comprising:
forming a gate line on a substrate;
forming a gate insulating layer on the gate line;
forming a semiconductor layer on the gate insulating layer;
forming a data line including a source electrode and a drain electrode both positioned on the semiconductor layer, a portion of the semiconductor layer lying between the source electrode and drain electrode being a channel portion;
depositing an insulating material on the data line and the drain electrode;
patterning the insulating material to form a passivation layer having a contact hole; and forming a pixel electrode connected to the drain electrode through the contact hole, wherein the gate line extends in a lengthwise direction and comprises an electrode portion and a line portion, the electrode portion being the portion of the gate line overlapping with the channel portion and the line portion intersecting the data line, wherein the channel portion of the semiconductor layer and the contact hole both overlap a centerline of the gate line in a plan view of the substrate, the centerline of the gate line extending in a direction the line portion of the gate line extends and crossing the line portion of the gate line, and wherein the drain electrode includes an opening disposed between two portions of the drain electrode and exposing a portion of the semiconductor layer.

15. The method of claim 14, further comprising:

patterning a portion of the drain electrode exposed by the contact hole so as to form an opening.

16. The method of claim 15, further comprising:

plasma-processing a portion of the semiconductor layer exposed by the opening.

17. The method of claim 16, wherein:

the plasma-processed portion of the semiconductor layer is an electrical insulator.

18. The method of claim 17, wherein:

the plasma processing includes oxygen plasma processing.

19. The method of claim 15, wherein:

an area of the opening is smaller than an area of the contact hole.

* * * * *